United States Patent [19]

Fujii

[11] Patent Number: 5,394,061
[45] Date of Patent: Feb. 28, 1995

[54] HIGH FREQUENCY PLASMA POWER SOURCE AND IMPEDANCE MATCHING DEVICE FOR SUPPLYING POWER TO A SEMICONDUCTOR PROCESSING APPARATUS

[75] Inventor: Syuitsu Fujii, Hiroshima, Japan

[73] Assignee: Adtec Co., Ltd., Hiroshima, Japan

[21] Appl. No.: 57,675

[22] Filed: May 5, 1993

[30] Foreign Application Priority Data

Jan. 14, 1993 [JP] Japan ................................. 5-021734

[51] Int. Cl.⁶ ............................................... H01J 7/24
[52] U.S. Cl. ................................ 315/111.21; 315/219; 315/244; 330/301
[58] Field of Search ............... 315/111.21, 111.31, 315/111.81, 219, 244; 330/301, 116, 117; 324/645

[56] References Cited

U.S. PATENT DOCUMENTS

| | | | |
|---|---|---|---|
| 4,945,317 | 7/1990 | Sato et al. ............................ | 330/301 |
| 5,008,894 | 4/1991 | Laakmann ............................ | 372/38 |
| 5,079,507 | 1/1992 | Ishida et al. ................... | 315/111.12 X |

*Primary Examiner*—Robert J. Pascal
*Assistant Examiner*—Haissa Philogene
*Attorney, Agent, or Firm*—Morgan & Finnegan

[57] ABSTRACT

In a high frequency plasma power supply comprising a final stage push-pull amplifier 2 with each phase having a parallel combination of at least two FETs, an output transformer 5 having the connection of the phase outputs of the push-pull amplifier 2 to the opposite terminals of a primary winding with a neutral tap, and a low pass filler 6 allowing passage of substantially the fundamental frequency component from the secondary winding output of the output transformer 5, the high frequency power passing through the low pass filter being supplied between the electrodes of a plasma chamber 10 through an impedance matching circuit 9 having an impedance adjusting mechanism, the dc voltage Vds to be applied between the drain and source of each FET of each phase of the push-pull amplifier is adjusted to not more than about 30% of the dc absolute rated value and the turn ratio of the output transformer is 1:4, thereby supplying the power having the level necessary for plasma reaction.

3 Claims, 5 Drawing Sheets

HIGH FREQUENCY PLASMA POWER SOURCE AND IMPEDANCE MATCHING DEVICE FOR SUPPLYING POWER TO A SEMICONDUCTOR PROCESSING APPARATUS

BACKGROUND OF THE INVENTION

The present invention relates to a high frequency plasma power supply and an automatic impedance matching device and more particularly to a system for supplying power to a plasma chamber in a semiconductor processing apparatus using high frequency plasma CVD or high frequency plasma etching treatment.

When power is to be supplied to a reaction chamber (plasma chamber) in high frequency plasma CVD process or high frequency plasma etching treatment, matching has to be made between the load impedance and the high frequency power supply impedance.

The load impedance of the chamber is determined by the magnitude of power to be supplied to the chamber (external condition) and various internal conditions, and high frequency power is supplied between the electrodes after starting at zero level it has undergone dark current level and dark current sweep leading to ignition level. In this case, since the high frequency plasma power supply receives reflective power from the chamber, a simple increase in applied power would result in the power value of the reflective waves reaching about 100% of the applied power, leading to the danger of the power supply device being damaged. Therefore, it has been common practice to resort to the shutdown method which is very complicated, consisting in controlling the traveling wave power value of the high frequency plasma power supply to ensure that the reflective wave power value is 10–20% less than the rated output while effecting impedance matching, thus increasing the power to the value necessary for the plasma reaction process for the whole chamber.

More particularly, during the process in which raw gas introduced into the chamber is converted into plasma by the power from a high frequency plasma power supply, the gas plasma load impedance sharply changes at the time of ignition. Further, since it also changes according to the flow rate, pressure, temperature of the raw gas, differences between the impedance of the high frequency plasma power supply (which impedance is usually taken to be 50Ω, the same value as that of coaxial cables) and the impedance in the chamber irregularly occur. For this reason, use is made of an automatic impedance matching device for an impedance matching circuit associated with power supply to the chamber, and it usually takes about 3–10 seconds before impedance matching for the driving system is attained. During this matching operation, 100% of the power is not consumed in the chamber, producing power reflection which accounts for the occurrence of power being fed back to the high frequency plasma power supply as described above.

In the conventional high frequency plasma power supply, to prevent damage to the final stage device (transistors, particularly FETs), use is generally made of the shutdown method to suppress the traveling wave power on the supply side so as to hold reflective wave power at less than 10–20% of the rated output if such reflective wave power is produced during mismatching of the plasma impedance. Since this method is a feedback control, i.e., an electrical loop control, it has the drawback that it sometimes fails to cope with a sharp change in impedance in the chamber, leading to damage to the final stage device of the high frequency plasma power supply.

In semiconductor producing factories, effective measures have been sought for to lower the high frequent breakdown in the power supply device, said high frequent breakdown has been a great obstacle to full automation.

In the shutdown method used to elevate the power to the value necessary for plasma process while controlling the traveling wave power value on the supply side, since there is a great difference in pre-ignition impedance and post-ignition impedance on the condition that the initial power necessary for plasma ignition is at least 10–20% of the rated output, the period of matching operation of the automatic impedance matching device ranging from the time when power supply is started to the time when the power reaches the value necessary for the process is relatively too long for smooth implementation of the recent process. And another drawback is that since this period is not definite, reproducibility is poor. Further, among the drawbacks in semiconductor treatment due to long plasma reaction time at a power value lower than the rated output is the problem that in CVD process, uniformity of film quality and reproducibility of film thickness are poor while in thin film etching process, overetching and underetching frequently occur owing to the poor reproducibility of applied power.

DISCLOSURE OF THE INVENTION

With the above in mind, the present invention is intended to provide a reliable and efficient high frequency plasma power supply and an automatic impedance matching device which lowers the frequent breakdown in a high frequency plasma power supply and which solves the problems concerning the uniformity of film quality and the reproducibility of film thickness in the film forming process based on plasma CVD and the reproducibility of applied power in the thin film etching process.

In a first arrangement for achieving the above object, the present invention provides a high frequency plasma power supply consisting of a final stage push-pull amplifier with each (push or pull) phase having a parallel combination of at least two FETs, an output transformer having the connection of the phase outputs of said push-pull amplifier to the opposite terminals of a primary winding with a neutral tap, and a low pass filter allowing passage of substantially the fundamental frequency component from the secondary winding output of said output transformer, the high frequency power passing through said low pass filter being supplied between the electrodes of a plasma chamber through an impedance matching circuit having an impedance adjusting mechanism, said high frequency plasma power supply being characterized in that the dc voltage Vds to be applied between the drain and source of each FET of each phase of said push-pull amplifier is adjusted to not more than about 30% of the dc absolute rated voltage and the turn ratio of said output transformer is greater than the turn ratio which was adopted when said Vds was about 50% of the dc absolute rated value, so as to generate the same high frequency voltage on the secondary side as when said Vds was about 50%, thereby supplying the power necessary for plasma reaction.

In a second arrangement, the invention provides an automatic impedance matching device to be connected to a high frequency plasma power supply which consists of a final stage push-pull amplifier with each phase having a parallel combination of at least two FETs, an output transformer having the connection of the phase outputs of said push-pull amplifier to the opposite terminals of a primary winding with a neutral tap, and a low pass filter allowing passage of substantially the fundamental frequency component from the secondary winding output of said output transformer, the high frequency power passing through said low pass filter being supplied between the electrodes of a plasma chamber through an impedance matching circuit having an impedance adjusting mechanism, said automatic impedance matching device being characterized in that an arithmetic section comprising a CPU and a storage device is installed to compute the plasma ignition level of high frequency power supplied between the electrodes of said plasma chamber by using parameters set according to the kind, flow rate and temperature of raw gas to be fed to said plasma chamber or material to be plasma-processed, thereby making it possible to compute and set the operation start position of said impedance adjusting mechanism in such a manner that in order to ensure that the high frequency power to be supplied between the electrodes of said plasma chamber is gradually elevated from the ignition level to the set power ignition level without providing the dark current sweep period extending from the zero level to the ignition level via the dark current level, the power output impedance including said impedance matching circuit is equal to the impedance of the plasma chamber at said ignition level.

In a third arrangement of the present invention, a high frequency plasma power supply and impedance matching device including said first and second arrangement is provided. According to the first arrangement of the invention, even if the set traveling wave output is maintained and unchanged when a sharp change in plasma impedance occurs in the chamber to produce a reflective wave power (with a reflectivity of 100% in an extreme case), the device operates without being damaged even if the drain-source voltage Vds of the final stage device (FET) of said power supply device has the reflective component superposed thereon, because the push-pull voltage to be applied as twice the sine wave effective value (not more than about 30% of the dc absolute rated value) which is Vds=E is sufficiently less than the absolute rated value thereof.

Further, in the second arrangement of the invention, the operation start position of the automatic impedance matching device, i.e., the voltage sweep start value is initially set in such a manner as to effect impedance matching at a voltage value set from the outside at the plasma ignition level or thereabouts; therefore, the heretofore used unstable, dark current sweep period can now be omitted. Such initial setting is performed by the CPU using the arithmetic parameters stored in the storage device.

Therefore, in the third arrangement which incorporates the first and second arrangements therein, the high frequency power to be supplied to the plasma reaction chamber from the power supply system can be made to reach the set supplied power with satisfactory reproducibility and at high speed, thus solving the basic problem, a solution which has long been sought for.

BRIEF DESCRIPTION OF THE DRAWINGS

FIG. 2 is a flowchart for explaining the operation flow leading to a failure after a conventional high frequency plasma power supply has been turned on;

DESCRIPTION OF THE PREFERRED EMBODIMENTS

Figure 1:
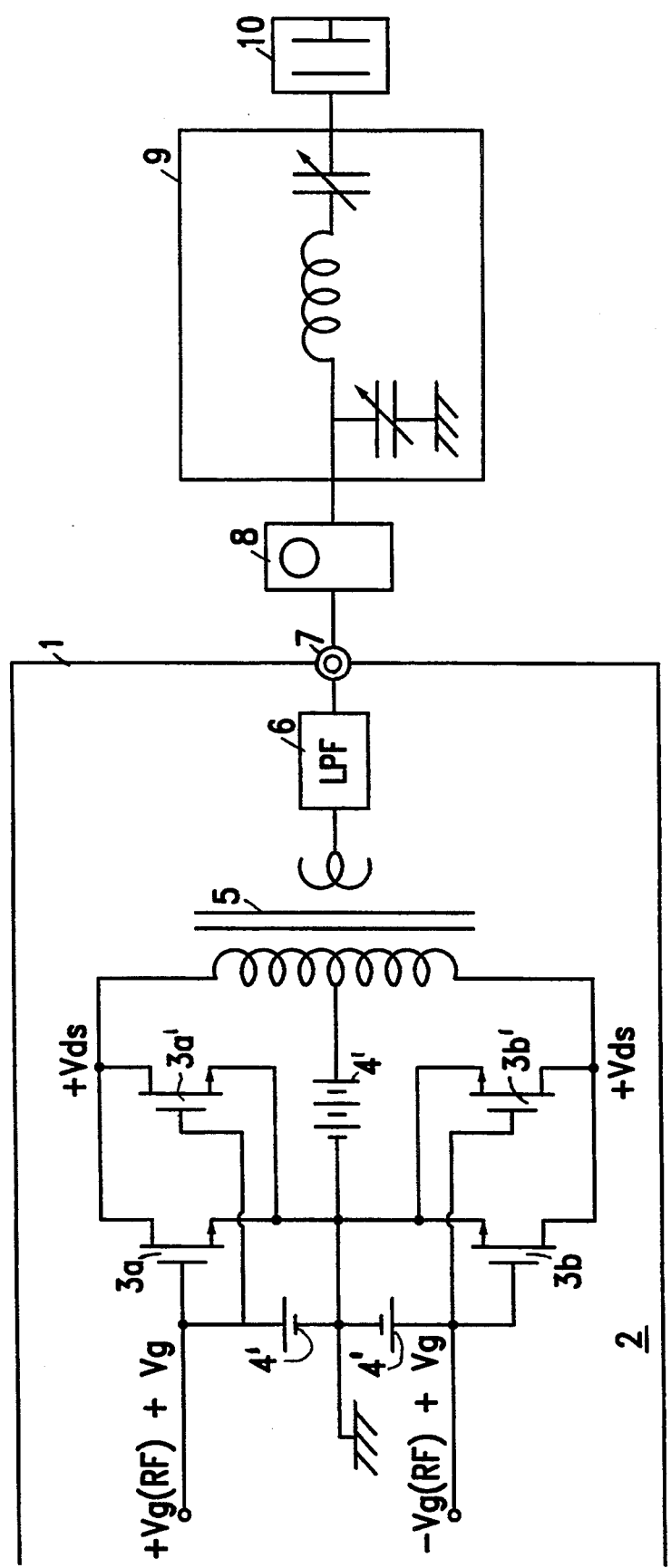
FIG. 1 is a schematic view showing the final stage power circuit of a high frequency plasma power supply device having the present inventive concept applied thereto, and also showing a circuit arrangement for supplying high frequency power to a chamber through said final stage power circuit.

FIG. 1 schematically shows the final stage power circuit of a high frequency plasma power supply device having the present inventive concept applied thereto, and also showing a circuit arrangement for supplying high frequency power to a chamber through said final stage power circuit. Each phase of the final stage push-pull circuit 2 of a high frequency plasma power supply has usually at least two FETs connected in parallel thereto, but for the sake of illustration it is shown having two FETs, 3a, 3a' for one phase and 3b, 3b' for the other, connected in parallel thereto. The character 4 indicating a cell symbol represents a dc power supply circuit for applying a dc voltage Vds between the drains and sources of the FETs 3a, 3a' and 3b, 3b' through the center tap of the primary winding of an output transformer 5 and the characters 4' indicating cell symbols represent the input gate bias power supplies for the FETs. The high frequency control signal vg to be applied to the gates of the FETs is separated into forward and reverse phases from a high frequency amplifier and a splitter circuit in the preceding stage (not shown). The high frequency voltages generated between the drains and sources of the parallel-connected FETs controlled by the high frequency voltage vg serving as the gate signal are applied to the primary winding of the transformer, whereby a high frequency power is supplied from the secondary winding inductively coupled therewith to the output terminal 7 through a low-pass filter 6. The output terminal 7 is connected to an impedance matching circuit 9 through a standing wave ratio meter (SWR) 8, the impedance matching output being supplied to the terminal of a chamber 10.

Figure 2:
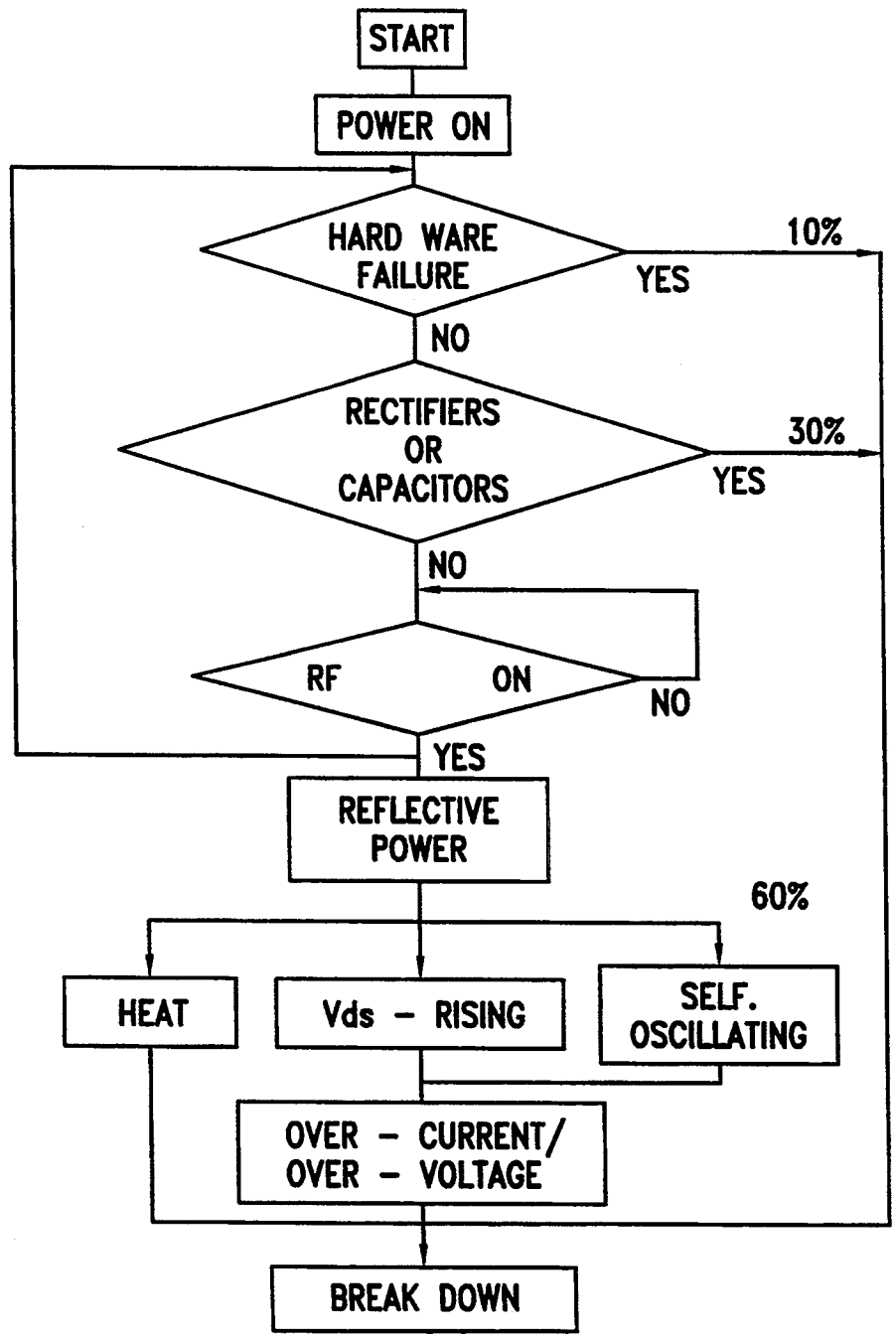

In this arrangement of the power supply device, theoretically twice as much as the dc voltage in the push-pull FETs is applied between the drains and sources of the FETs 3a, 3a' and 3b, 3b' in the final stage of the power supply circuit. Further, there are a voltage rise of about 20% produced by the back electromotive force of the transformer and a reflective voltage (decreased by the reciprocal of the turn ratio) from the chamber, and in the conventional arrangement these are superposed, causing the voltage breakdown between the drain and source. FIG. 2 is a flowchart prepared according to the analysis and statistic of causes of failures in a conventional high frequency plasma power supply, showing an operation flow leading to a failure after the power has been turned on. As is clear from this figure, failures in switches, wiring connectors and other hardware form 10% of the total number of failures and failures in rectifiers or capacitors in the basic smoothing circuit of the power supply device form 30%. It also shows that if there is no such failure, there are other failures leading to damage, which form 60%, such as FETs receiving reflective waves to be burnt owing to their sustained heating or dielectric breakdown (instantaneous burning) caused by overcurrent/overvoltage owing to increased Vds voltage and self oscillation.

The present invention, primarily intended to prevent said breakdown of FETs, provides improvements in the arrangement of the final stage FETs and output transformer. More particularly, on the assumption that the overall arrangement of the FETs 3a, 3a' and 3b, 3b' in the individual phases of the push-pull amplifier 2 allows passage of a larger current than do the conventional group of FETs, the number of FETs is predetermined according to the standards of FETs (e.g., at 4 elements-)and the dc voltage Vds to be applied between the drains and sources of these FETs is set at about 30% of the dc absolute rated value. The proportion of the Vds in such circuit in the conventional arrangement to the dc absolute rated value is about 50%. In the embodiment of the present, invention however a voltage about 20% lower than the conventional voltage (about 30% in the proportion or less) is applied. Thus, the decrease in the output voltage due to this is such that substantially the same output level attained by predetermining the turn ratio of the output transformer at 4/3 times the conventional value (which was 1:3 in general ), or 1:4, substantially the same output level is attained. As the turn ratio is increased, the current in the primary winding of the transformer is increased for the same power supply to the same load; the aforesaid predeterminations including the number of FETs function effectively for them to withstand this current demand.

Figure 3:
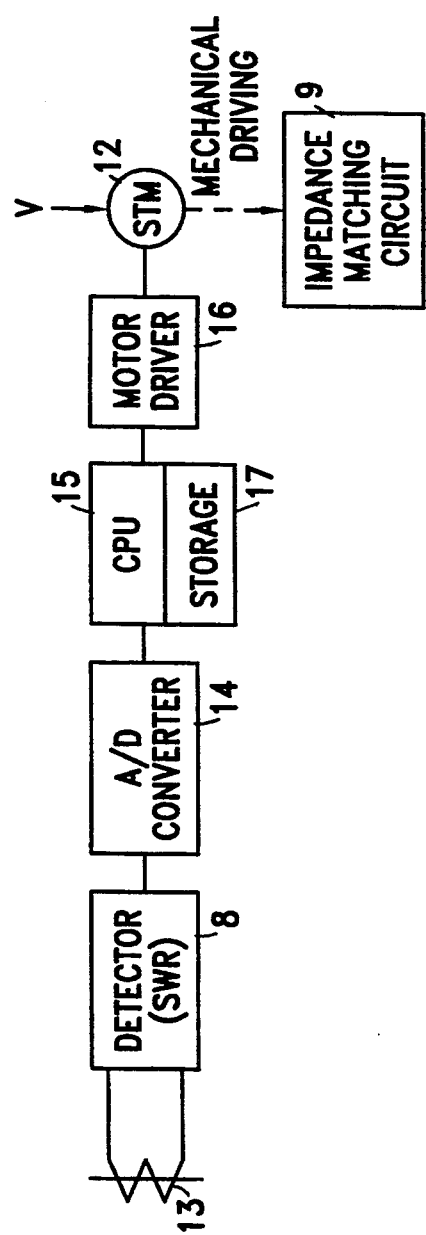
FIG. 3 is a block diagram showing the automatic impedance matching device of the present invention.

With the final stage amplifying circuit thus arranged, it is clear that even if the reflective waves from the chamber are 100%, they are reduced to 3/4 times the conventional value in that the turn ratio of the output transformer 5 is 1:4. Coupled with the fact that the set voltage for FETs has been reduced to 30%, this ensures that the FETs operates normally without receiving any shock even when receiving 100% reflective waves, making it possible to cope with overvoltage conditions without providing a protective circuit or performing shutdown. FIG. 3 shows an impedance matching device according to the present invention. This device 1 is adapted to adjust a variable impedance element in an impedance matching circuit (the circuit 9 in FIG. 1) through a stepping motor 12. The automatic impedance matching device 11 comprises a detecting section 8 including a standing wave ratio meter (SWR) having a detecting coil 13 for detecting signal waves in a coaxial cable extending from the output terminal 7 of a high frequency power supply, an AD converter connected to the output of said detecting section, a CPU 15 for receiving digital output from the AD converter, and a motor driver 16 controlled by the CPU 15, said motor driver 16 controlling and driving said stepping motor 10. The CPU 15 contains or is connected to a storage device 17 for storing various parameters. The automatic impedance matching device 11 uses a stepping motor 12 instead of a DC motor (analog drive) used in the conventional device, so as to make it possible to effect digital control and improve the torque characteristic, thereby making the initial setting of the impedance matching circuit corresponding to the ignition voltage for the plasma chamber externally set or automatically set using the CPU 15 and storage device 17. That is, in the present invention, since the decrease in conditions which damage FETs as described above eliminates the necessity for providing a dark current sweep period for high frequency power to be supplied between the electrodes of the plasma chamber starting at the zero level to the ignition level via the dark current level, the impedance matching operation can be started in the matching position at the ignition level, thereby decreasing the time required for the plasma reaction to become stabilized.

Figure 4:
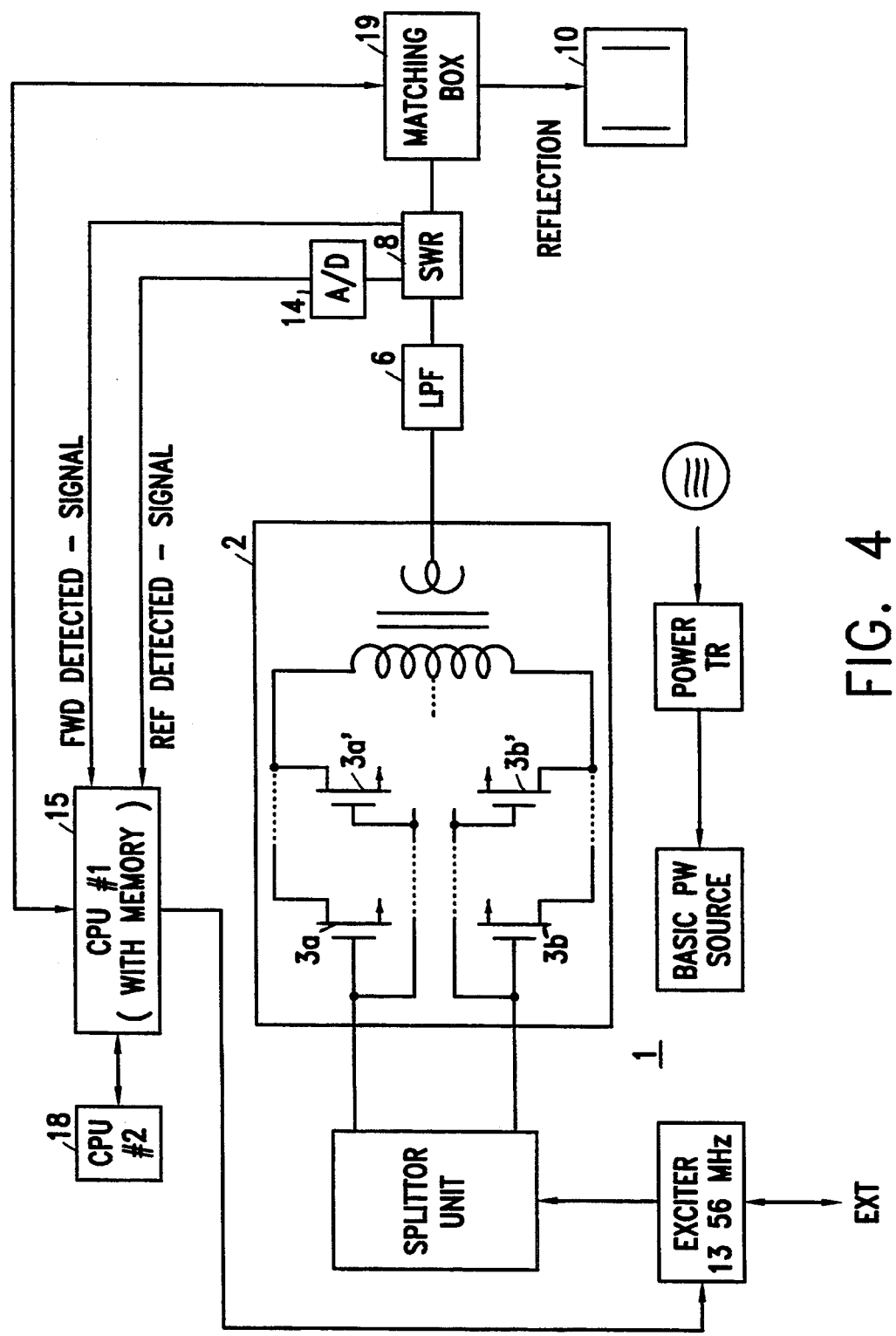
FIG. 4 is a block diagram showing the entire system arrangement of the invention.

FIG. 4 is a block diagram of a power supply system including all of the high frequency power supply circuit and automatic impedance matching device of the present invention. The phases of the push-pull circuit 2 in the final stage of the high frequency power supply circuit 1 are provided with at least two parallel-connected FETs 3a, 3a' and 3b, 3b'.

In this system arrangement, the parts marked with the same reference characters as those used in FIGS. 1 and 3 are the same parts described above, and the others will be understood by reference to the legend given in the block diagram. As for CPUs, in addition to the same CPU 15' as the one 15 installed in the automatic impedance matching device, there is included a CPU 18 for external control. The automatic impedance control device and the impedance matching circuit operated thereby are shown integrally installed in the matching box 19.

As has so far been described, according to the arrangement of the present invention, the matching rate is very high even for a sharp change in the plasma impedance load in the chamber caused by application of high frequency power, thus making it possible to supply the required ignition power with sufficient safety and provide a high frequency electric energy supplying system which is superior in reproducibility.

Therefore, the present invention makes it possible to decrease the failure rate of the high frequency plasma power supply, to set the initial power of the high frequency electric energy at a value above the plasma ignition level, and to preset the initial matching position for plasma impedance in the vicinity of the ignition state.

Figure 5:
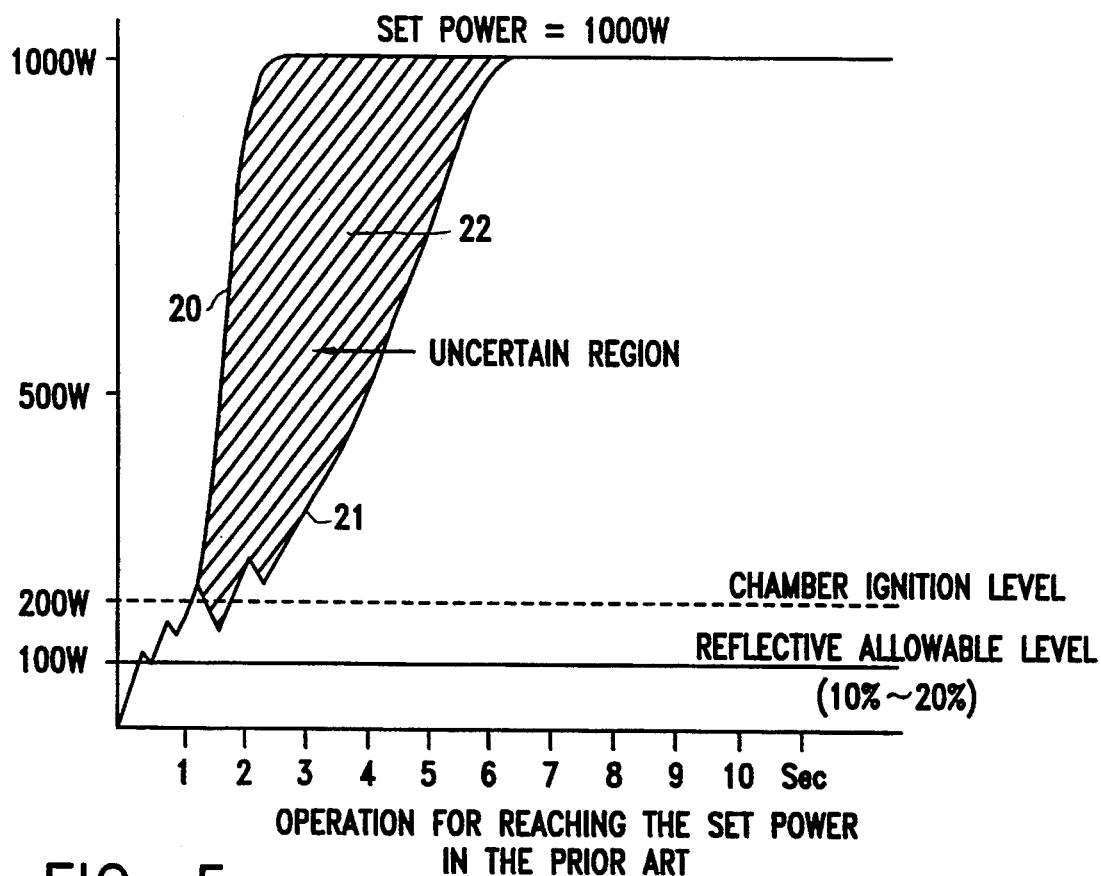
FIG. 5 is a power curve showing the operation continuing till the set power is reached in a conventional high frequency power supply.
Figure 6:
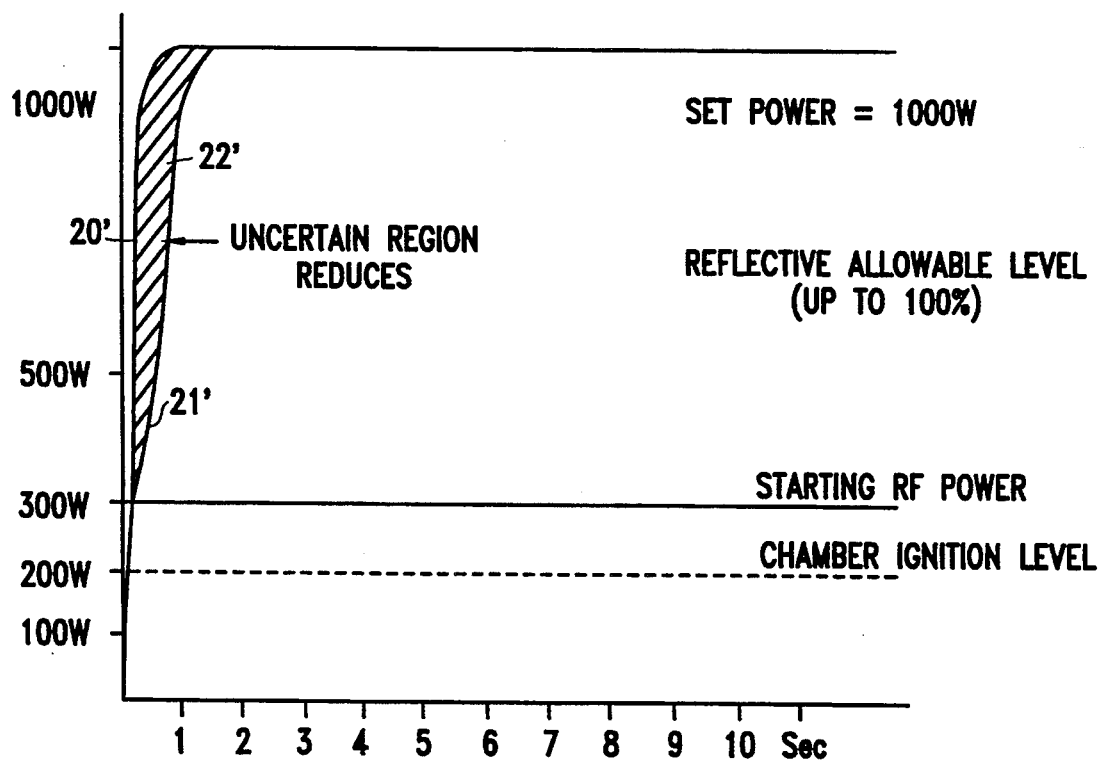
FIG. 6 is a power curve showing the operation continuing till the set power is reached in the high frequency power supply of the present invention.

Finally, a comparison will now be made between the prior art and present inventive power supply systems. (1) The shutdown control based on the prior art was effected by setting the reflective wave power at 10-20% or less of the rated output and gradually increasing the high frequency power in accordance with the movement of the automatic impedance matching device, obtaining a power curve (FIG. 5), while (2) in the present invention, with such shutdown control omitted and with the high frequency power set at the initial ignition level, the automatic impedance matching device was driven, obtaining a power curve (FIG. 6). It will be noted that the present invention effects stable, high frequency power control. That is, in the prior art, as shown in FIG. 5, there is a large uncertain region as indicated by a shaded region 22 surrounded by a discontinuous wavy rise up to the ignition level for applied power, a theoretical line 20 extending to a set power (1000 W), and the most stable conceivable line 21, whereas in the present invention shown in FIG. 6, an uncertain region 22' surrounded by such theoretical line 20' and a rising line conceivable is extremely slender and small, thus demonstrating that the set power is rapidly supplied with good reproducibility.

What is claimed is:

1. In a high frequency plasma power supply consisting of a final stage push-pull amplifier with each phase having a parallel combination of at least two FETs, an output transformer having the Connection of the phase outputs of said push-pull amplifier to the opposite terminals of a primary winding with a neutral tap, and a low pass filter allowing passage of substantially the fundamental frequency component from the secondary winging output of said output transformer, the high frequency power passing through said low pass filter being supplied between the electrodes of a plasma chamber through an impedance matching circuit having an impedance adjusting mechanism, a high frequency plasma power supply and impedance matching device characterized in that the dc voltage Vds to be applied between the drain and source of each FET of each phase of said push-pull amplifier is adjusted to not more than about 30% of a dc rated voltage and the turn ratio of said output transformer is greater than the turn ratio which was adopted when said Vds was about 50% of the dc absolute rated value, so as to generate the same high frequency voltage on the secondary side as when said Vds was about 50%, thereby supplying the power necessary for plasma reaction, and in that an arithmetic section comprising a CPU and a storage device is installed to compute the plasma ignition level of high frequency power supplied between the electrodes of said plasma chamber by using parameters set according to the kind, flow rate and temperature of raw gas to be fed to said plasma chamber or material to be plasma-processed, thereby making it possible to compute and set the operation start position of said impedance adjusting mechanism in such a manner that in order to ensure that the high frequency power to be supplied between the electrodes of said plasma chamber is gradually elevated from the ignition level to the set power ignition level without providing the dark current sweep period extending from the zero level to the ignition level via the dark current level, the power output impedance including said impedance matching circuit is equal to the impedance of the plasma chamber at said ignition level.

2. A high frequency plasma power supply circuit comprising:

a final stage push-pull amplifier with each phase having a parallel combination of at least two FETs;

an output transformer having the connection of the phase outputs of said push-pull amplifier to opposite terminals of a primary winding with a neutral tap;

a low pass filter allowing passage of substantially the fundamental frequency component from a secondary winding output of said output transformer;

an impedance matching circuit positioned between said low pass filter and electrodes of a plasma chamber, said impedance matching circuit having an impedance adjusting mechanism, characterized in that a dc voltage Vds to be applied between drain and source of each FET of each phase of said push-pull amplifier is adjusted to not more than about 30% of a dc rated voltage assigned thereto and said output transformer has a turn ratio N1:N2 where $N1=1$ and $N2>3$, so as to generate substantially the same high frequency voltage on the secondary side as when said Vds was about 50%, thereby supplying the power necessary for plasma reaction; and an arithmetic section comprising a CPU and a storage device to compute a plasma ignition level of high frequency power supplied to said plasma chamber by using parameters set according to the kind, flow rate and temperature of raw gas to be fed to said plasma chamber or material to be plasma-processed, thereby making it possible to compute and set an operation start position of said impedance adjusting mechanism in such a manner that in order to ensure that said high frequency power to said plasma chamber is initiated from said ignition level and gradually increased therefrom to a predetermined plasma power level without going through the dark current sweep from a zero level to said ignition level, power output impedance including said impedance matching circuit is equal to the impedance of said plasma chamber at said ignition level.

3. The circuit according to claim 2, wherein said output transformer has a turn ratio N1:N2 where $N1=1$ and $N2=4$.

* * * * *